(12) United States Patent
Yaung

(10) Patent No.: US 7,180,049 B2
(45) Date of Patent: Feb. 20, 2007

(54) IMAGE SENSOR WITH OPTICAL GUARD RINGS AND METHOD FOR FORMING THE SAME

(75) Inventor: Dun-Nian Yaung, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 190 days.

(21) Appl. No.: 10/983,549

(22) Filed: Nov. 8, 2004

(65) Prior Publication Data
US 2006/0097133 A1    May 11, 2006

(51) Int. Cl.
*H01L 21/441*    (2006.01)
(52) U.S. Cl. .............................. 250/214.1; 250/208.1; 257/432

(58) Field of Classification Search ............. 250/208.1, 250/214.1, 214 R; 257/231, 291, 292, 294, 257/297, 432, 446; 438/319, 411, 422, 428, 438/619
See application file for complete search history.

(56) References Cited

U.S. PATENT DOCUMENTS

| 5,859,450 | A  | * | 1/1999  | Clark et al. ............... 257/233 |
| 7,012,240 | B2 | * | 3/2006  | Yaung ..................... 250/214.1 |
| 2002/0149078 | A1 | * | 10/2002 | Hynecek ................... 257/461 |
| 2005/0280007 | A1 | * | 12/2005 | Hsu et al. .................. 257/79 |

* cited by examiner

*Primary Examiner*—Stephone B. Allen
(74) *Attorney, Agent, or Firm*—Thomas, Kayden, Horstemeyer & Risley

(57) ABSTRACT

An image sensor with optical guard rings is provided. The optical guard rings are embedded in a stacked inter-metal dielectric layer between the sensor areas, that is, around each pixel. The refraction index (RI) of the optical guard rings is smaller than that of the stacked inter-metal dielectric layer. Therefore, the incident light with a large angle of incidence is blocked by the optical guard rings and cannot arrive at the adjacent pixels.

27 Claims, 5 Drawing Sheets

IMAGE SENSOR WITH OPTICAL GUARD RINGS AND METHOD FOR FORMING THE SAME

BACKGROUND OF THE INVENTION

1. Field of the Invention

This invention relates generally to an image sensor. In particular, it relates to an image sensor with optical guard rings to prevent cross-talk issue between adjacent pixels.

2. Description of the Related Art

Solid state image sensors are necessary components in many optoelectronic devices, including digital cameras, cellular phones, and toys. Conventional solid-state image sensors for color analog or digital video cameras are typically charge-coupled device (CCD) or complementary metal oxide semiconductor (CMOS) photodiode array structures which comprise a spectrally photosensitive layer below one or more layers patterned in an array of color filters and above which resides a surface-layer array of microlens elements. The elementary unit of the image sensor is defined as a pixel. The basic technology used to form the CMOS image sensor is common to both types sensors.

The CMOS image sensor comprises a photo detector for detecting light and a logic circuit for converting the detected light into an electric signal representing data regarding the detected light. The fill factor, sometimes referred to as the aperture efficiency, is the ratio of the size of the light-sensitive area to the size of the total pixel size. Although efforts have been made to increase the fill factor of the image sensor and thereby increase the sensor sensitivity, further increases in the fill factor are limited because the associated logic circuitry cannot be completely removed. In order to increase the sensitivity of the light, a microlens formation technology has been used to converge and focus the incident light onto the photo detector by changing the path of the light that reaches the lens of the photo detector. In order for the image sensor to detect and provide a color image, it typically must include both a photo detector for receiving the light and generating and accumulating charge carriers and a color filter array (CFA), i.e., a plurality of color filter units sequentially arranged above the photo detector. The CFA typically uses one of two alternative three-color primary configurations, either red R, green G and blue B (RGB) or yellow Y, magenta M and cyan C (CMY). A plurality of microlenses are positioned above the color filter array to increase the photo-sensitivity of the image sensor.

FIG. 1 shows a traditional image sensor disposed in the substrate. The incident light 30 may not effectively focus on the photodiode 12 and may transmit to the adjacent photodiode 12'. As the pixel size is shrunk and multi-layer metal is used to reduce sensor cost, the cross-talk issue is more serious due to light scattering coming from metal layers 16 and 20. Thus, for black and white sensors in particular, image resolution is degraded. Furthermore, color correction is more difficult for color sensors.

SUMMARY OF THE INVENTION

Accordingly, it is the object of this invention to provide an image sensor to prevent cross-talk problem occurring between adjacent pixels.

To achieve the above objects, an image sensor with optical guard rings around sensor areas is provided. The optical guard rings with low RI material are embedded in the stacked inter-metal dielectric layer between the sensor areas. The refraction index (RI) of the optical guard rings is smaller than that of the stacked inter-metal dielectric layer. Therefore, the incident light with a large angle of incidence is blocked by the optical guard rings and cannot arrive at the adjacent pixels.

DETAILED DESCRIPTION OF THE INVENTION

FIGS. 2A to 2D illustrate a method for fabricating an image sensor in accordance with the present invention by significantly modifying the conventional image sensor fabrication process to include the formation of guard rings with low refraction index (RI).

Figure 1:
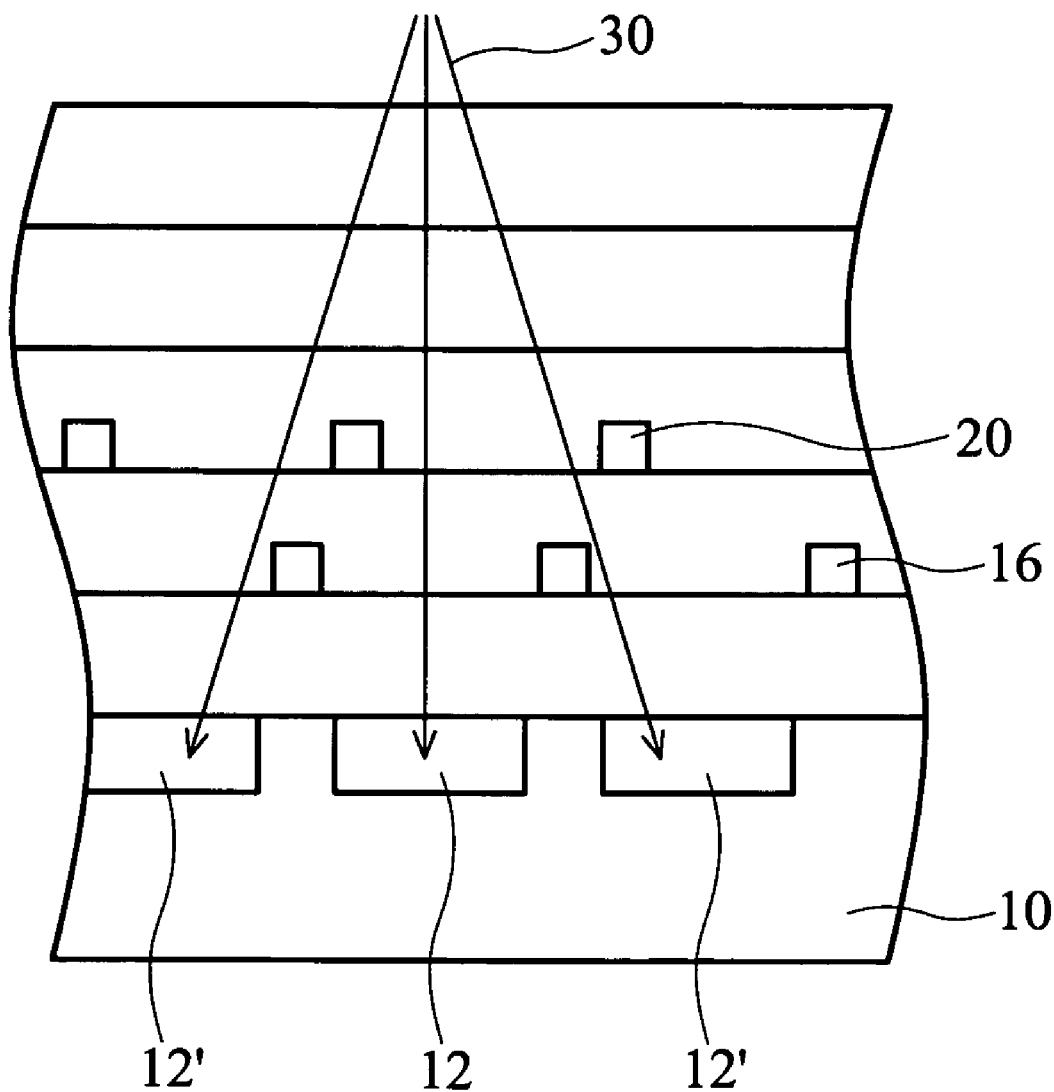
FIG. 1 shows a traditional image sensor without optical guard ring disposed in the substrate.
Figure 2A:
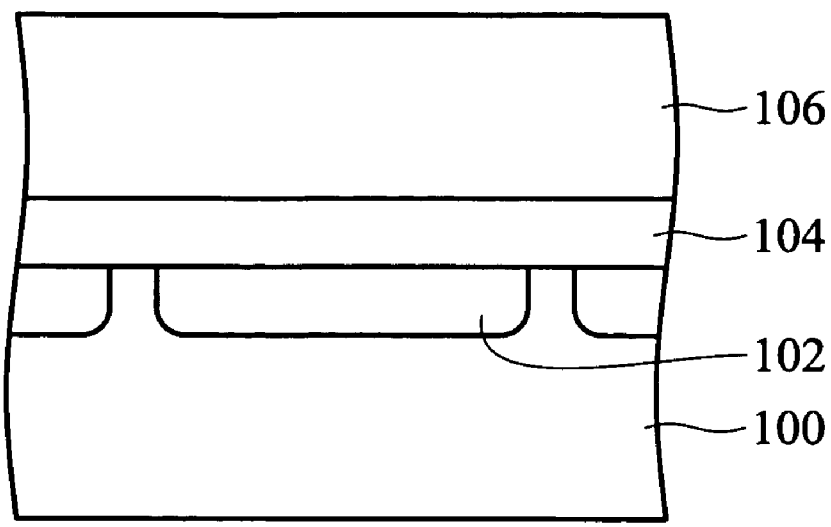
FIGS. 2A to 2D illustrate a method for fabricating an image sensor in accordance with one embodiment of the present invention.

As shown in FIG. 2A, a sensor area, such as a photodiode 102, is formed in a semiconductor substrate 100. Other elements, such as transistors (not shown), are also formed in or on the semiconductor substrate 100. An interlayer dielectric layer (ILD layer) 104, which is a pre-metal light transmitting dielectric layer, is formed on the semiconductor substrate 100 to cover those elements.

An interconnection process is performed to form multi-layer metal lines (not shown) except above the photodiode 102 and multi-layer insulators isolating the metal lines. The multi-layer insulators, also referred as a stacked inter-metal dielectric layer, are shown in figures as a layer 106. For example, a first metal layer is deposited on the ILD layer 104 and selectively patterned to form a first metal line on the ILD layer 104 except above the photodiode 102. After a first inter-metal dielectric layer for insulating adjacent metal lines from each other is deposited and planarized on the first metal line, a second metal layer is deposited on the first inter-metal dielectric layer and selectively patterned and etched to generate a second metal line positioned generally above the first metal line. A second inter-metal dielectric layer for insulating the adjacent metal lines from each other is deposited and planarized. The following interconnection process is then performed.

Figure 2B:
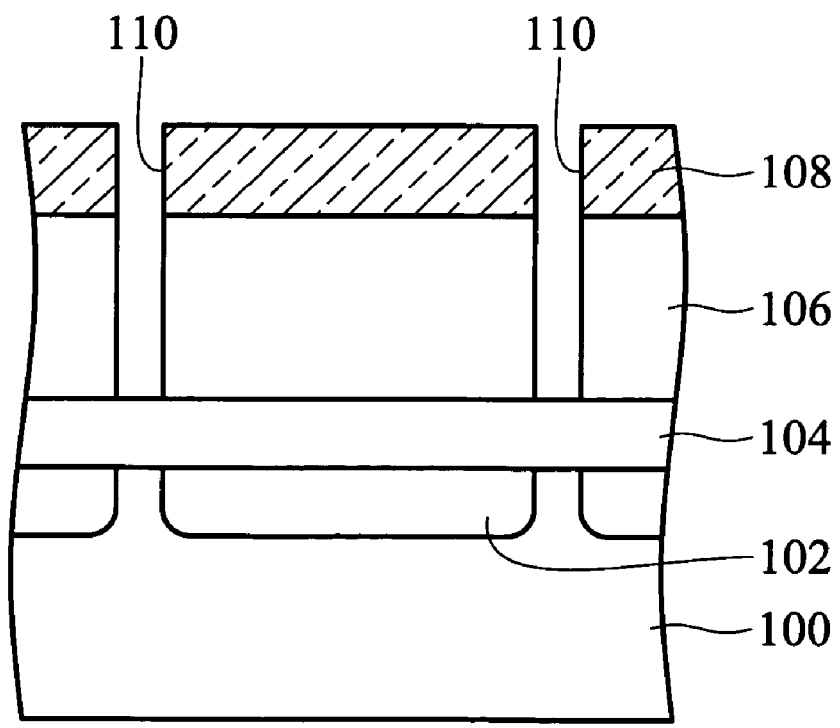

As shown in FIG. 2B, an energy sensitive layer, such as photoresist layer 108, is deposited on the stacked inter-metal dielectric layer 106 and patterned utilizing conventional photolithography process to form an optical guard ring pattern. The patterned photoresist layer 108 with the optical guard ring pattern is used as a mask for etching the stacked inter-metal dielectric layer 106, thereby forming openings between pixels, that is, around each pixel boundary.

Figure 2C:
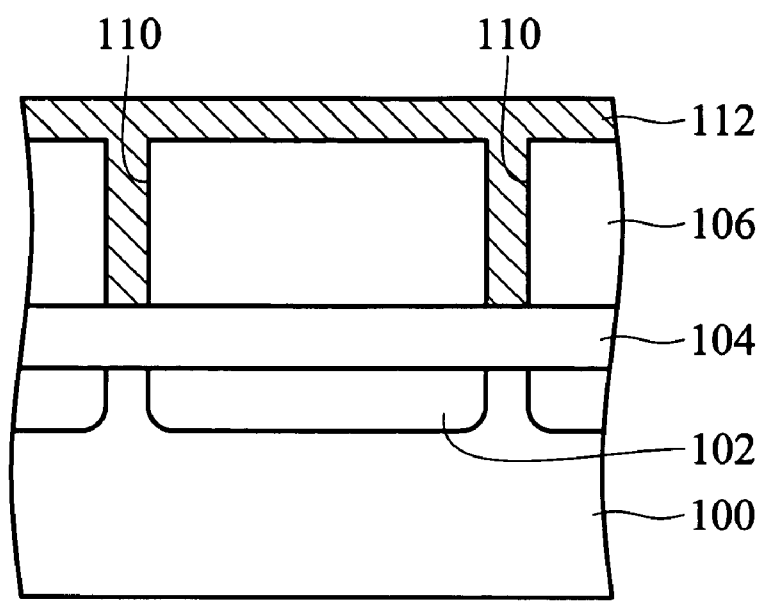
Figure 2D:
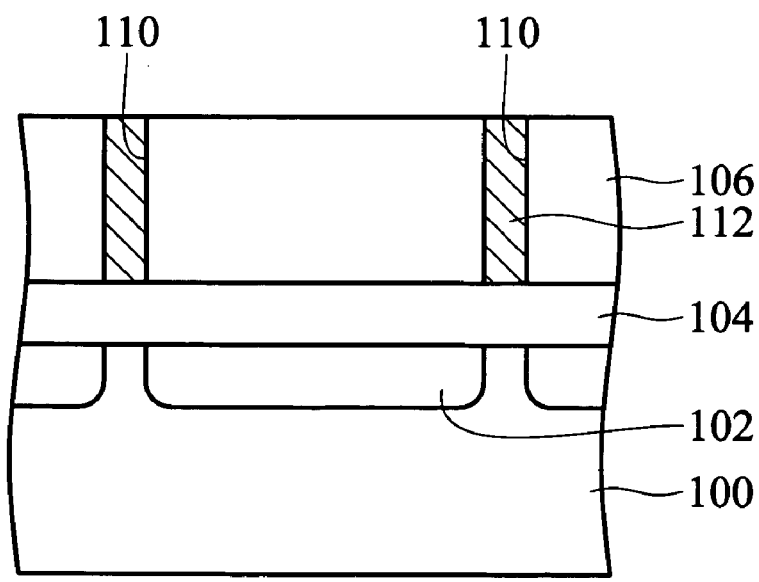
Figure 3:
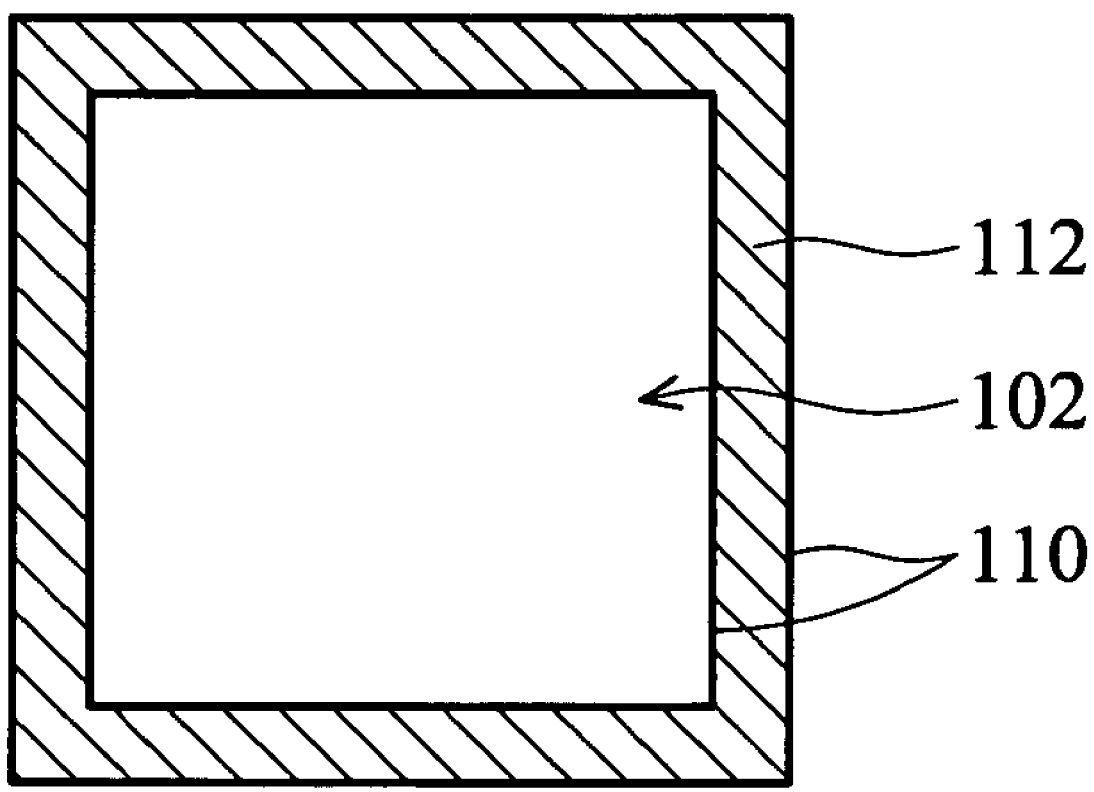
FIG. 3 shows a layout of a portion of a pixel of an image sensor with optical guard rings formed in the stacked inter-metal dielectric layer.

As shown in FIG. 2C, a low RI and light transmitting insulating layer 112 is formed on the stacked inter-metal dielectric layer 106 filling the openings 110. The low RI and light transmitting insulating layer 112 is preferably an organic spin-on material, for instance SiLK (manufactured by Dow), which has a refraction index (RI=1.35) which is smaller than that of the silicon oxide (RI=1.46) usually used to form the stacked inter-metal dielectric layer 106. The low RI and light transmitting insulating layer 112 over the stacked inter-metal dielectric layer 106 is then removed by etching back or CMP (chemical mechanical polishing), as shown in FIG. 2D. The low RI and light transmitting insulating layer 112 is embedded in the stacked inter-metal dielectric layer 106 to form an optical guard ring. An example of the layout of the optical guard ring 112 and the photodiode 102 is shown in FIG. 3, wherein the optical guard ring 112 is disposed around the photodiode 102 to prevent cross-talk to the adjacent pixels. The shape of the photodiode 102 is not limited to that in FIG. 3.

Figure 4:
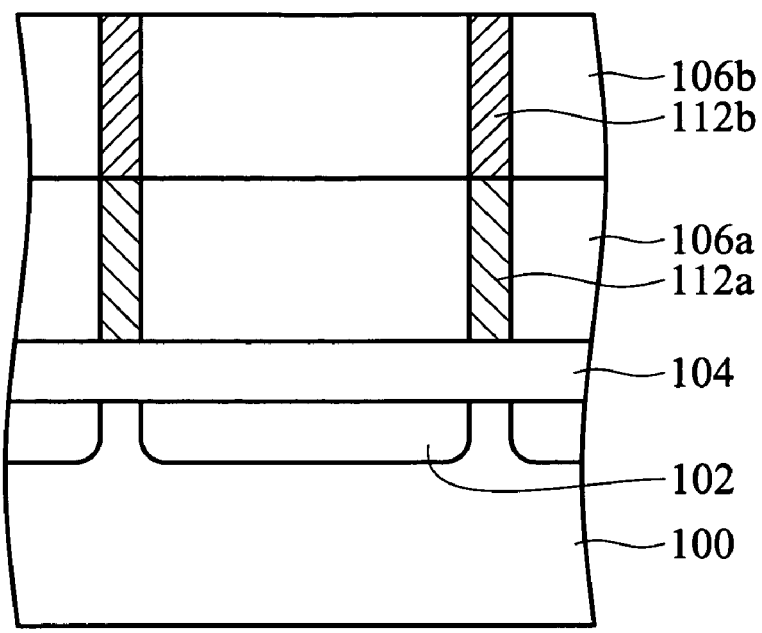
FIG. 4 shows an image sensor with optical guard rings formed by two etching and coating processes.

FIG. 2D shows that the optical guard rings 112 may be embedded in the stacked inter-metal dielectric layer 106 in such a way as to penetrate the entire layer. In another embodiment, the optical guard rings 112 may be embedded in the stacked inter-metal dielectric layer 106 in such a way that only parts of the stacked inter-metal dielectric layer 106 are penetrated. In the former, the optical guard rings 112 can be formed by one etching process (as shown in FIG. 2D), or formed by two or more etching processes (as shown in FIG. 4). As shown in FIG. 4, the optical guard rings 112a is formed in the lower stacked inter-metal dielectric layer 106a by the first etching process, and the optical guard rings 112b is formed in the upper stacked inter-metal dielectric layer 106b by the second etching process. In the latter, the optical guard rings 112a can be formed in the lower stacked inter-metal dielectric layer 106a, while the upper stacked inter-metal dielectric layer 106b is formed on the lower stacked inter-metal dielectric layer 106a without optical guard rings therein, as shown in FIG. 5.

Figure 5:
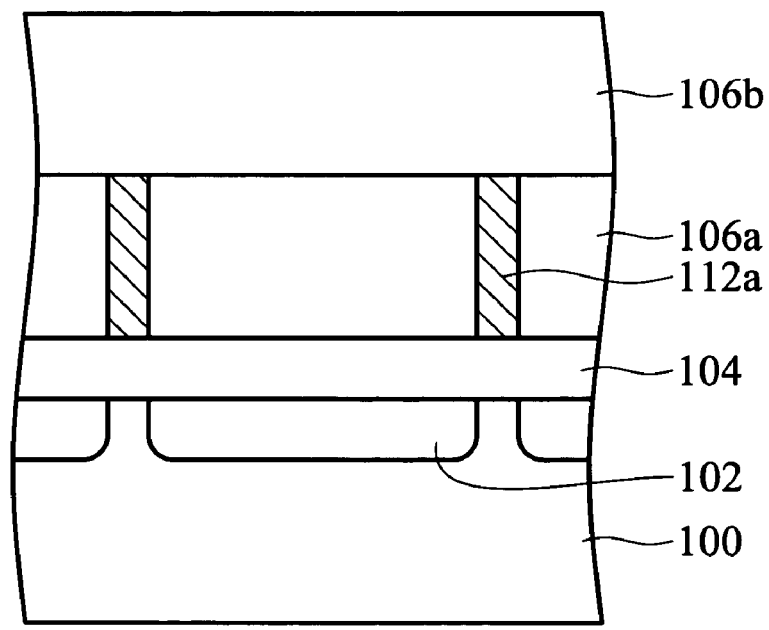
FIG. 5 shows an image sensor with optical guard rings formed in lower inter-metal dielectric layer.

The optical guard rings 112, 112a and 112b used to prevent cross-talk between adjacent pixels in the present invention have a refraction index smaller than the stacked inter-metal dielectric layer 106, 106a and 106b respectively, as shown in FIGS. 2D, 4 and 5. Typically, the incident angel of the incident light is preferably larger than 19°. For example, if the stacked inter-metal dielectric layer has RI=1.46 and the optical guard rings have RI=1.35, the incident light is completely reflected when the incident angel is larger than $\sin^{-1}$ (1.36/1.45), i.e. 67°.

The image sensor having optical guard rings to prevent incident light from transmitting to different pixels, e.g., cross-talk, improves image resolution for black and white image sensors or color correction for color image sensors.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An image sensor with optical guard rings, comprising:
a substrate having at least a sensor areas for each pixel;
a first stacked inter-metal dielectric layer disposed on the substrate; and
first optical guard rings embedded in the first stacked inter-metal dielectric layer between the sensor areas, wherein the refraction index (RI) of the first optical guard rings is smaller than the RI of the first stacked inter-metal dielectric layer.

2. The image sensor with optical guard rings of claim 1, further comprising an interlayer dielectric layer (ILD layer) disposed between the first stacked inter-metal dielectric layer and the substrate.

3. The image sensor with optical guard rings of claim 1, wherein the first optical guard rings are made of an organic spin-on material.

4. The image sensor with optical guard rings of claim 1, wherein the RI of the first optical guard rings is 1.35 and the RI of the first stacked inter-metal dielectric layer is 1.46.

5. The image sensor with optical guard rings of claim 4, wherein the first optical guard rings are made of SiLK and the first stacked inter-metal dielectric layer is made of silicon oxide.

6. The image sensor with optical guard rings of claim 1, further comprising a second stacked inter-metal dielectric layer disposed on the first stacked inter-metal dielectric layer.

7. The image sensor with optical guard rings of claim 6, further comprising second optical guard rings embedded in the second stacked inter-metal dielectric layer between the sensor areas, wherein the RI of the second optical guard rings is smaller than the RI of the second stacked inter-metal dielectric layer.

8. A device comprising an image sensor embedded therein, wherein the image sensor comprises:
a substrate having at least a sensor areas for each pixel;
a first stacked inter-metal dielectric layer disposed on the substrate; and
first optical guard rings embedded in the first stacked inter-metal dielectric layer between the sensor areas, wherein the refraction index (RI) of the first optical guard rings is smaller than the RI of the first stacked inter-metal dielectric layer.

9. The device of claim 8, wherein the device is a cellular phone.

10. The device of claim 8, wherein the device is a digital camera.

11. The device of claim 8, wherein the device is a toy.

12. An image sensor with optical guard rings, comprising:
a substrate having at least one sensor area for each pixel;
a first stacked inter-metal dielectric layer disposed on the substrate; and
first optical guard rings embedded in the first stacked inter-metal dielectric layer around each sensor area, wherein incident light is completely reflected when the incident angle is larger than 19°.

13. The image sensor with optical guard rings of claim 12, further comprising an interlayer dielectric layer (ILD layer) disposed between the first stacked inter-metal dielectric layer and the substrate.

14. The image sensor with optical guard rings of claim 12, wherein the first optical guard rings are made of an organic spin-on material.

15. The image sensor with optical guard rings of claim 12, wherein the RI of the first optical guard rings is smaller than that of the first stacked inter-metal dielectric layer.

16. The image sensor with optical guard rings of claim 15, wherein the RI of the first optical guard rings is 1.35 and the RI of the first stacked inter-metal dielectric layer is 1.46.

17. The image sensor with optical guard rings of claim 16, wherein the first optical guard rings is made of SiLK and the first stacked inter-metal dielectric layer is made of silicon oxide.

18. The image sensor with optical guard rings of claim 12, further comprising a second stacked inter-metal dielectric layer disposed on the first stacked inter-metal dielectric layer.

19. The image sensor with optical guard rings of claim 18, further comprising second optical guard rings embedded in the second stacked inter-metal dielectric layer between the sensor areas, wherein the RI of the second optical guard rings is smaller than the RI of the second stacked inter-metal dielectric layer.

20. A device comprising an image sensor embedded therein, wherein the image sensor comprises:
　a substrate having at least one sensor area for each pixel;
　a first stacked inter-metal dielectric layer disposed on the substrate; and
　first optical guard rings embedded in the first stacked inter-metal dielectric layer around each sensor area, wherein incident light is completely reflected when the incident angle is larger than 19°.

21. A method for forming an image sensor with optical guard rings, comprising:
　providing at least a sensor areas in a substrate for each pixel;
　forming an interlayer dielectric layer on the substrate and the sensor areas;
　forming a first stacked inter-metal dielectric layer on the interlayer dielectric layer;
　forming a plurality of openings in the first stacked inter-metal dielectric layer around each pixel; and
　filling a light transmitting insulating material in the openings to be optical guard rings, wherein the RI of the light transmitting insulating material is smaller than the RI of the first stacked inter-metal dielectric layer.

22. The method for forming an image sensor with optical guard rings of claim 21, wherein the light transmitting insulating material is an organic spin-on material.

23. The method for forming an image sensor with optical guard rings of claim 21, wherein filling the low RI and light transmitting insulating material in the openings comprises:
　coating the light transmitting insulating material on the first stacked inter-metal dielectric layer and in the openings; and
　removing the light transmitting insulating material over the first stacked inter-metal dielectric layer.

24. The method for forming an image sensor with optical guard rings of claim 23, wherein the light transmitting insulating material over the first stacked inter-metal dielectric layer is removed by etching back.

25. The method for forming an image sensor with optical guard rings of claim 23, wherein the light transmitting insulating material over the first stacked inter-metal dielectric layer is removed by CMP.

26. The method for forming an image sensor with optical guard rings of claim 21, wherein the RI of the optical guard rings is 1.35 and the RI of the first stacked inter-metal dielectric layer is 1.46.

27. The method for forming an image sensor with optical guard rings of claim 21, wherein the optical guard rings is made of SiLK and the first stacked inter-metal dielectric layer is made of silicon oxide.

* * * * *